US009479055B2

(12) United States Patent
Okamatsu et al.

(10) Patent No.: US 9,479,055 B2
(45) Date of Patent: Oct. 25, 2016

(54) DC-DC CONVERTER

(71) Applicant: Panasonic Intellectual Property Management Co., Ltd., Osaka (JP)

(72) Inventors: Masashi Okamatsu, Osaka (JP); Hideki Tanaka, Shiga (JP); Katsuya Hagiwara, Osaka (JP); Masahiro Tochigi, Osaka (JP); Takashi Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/647,596

(22) PCT Filed: Nov. 27, 2013

(86) PCT No.: PCT/JP2013/006966
§ 371 (c)(1),
(2) Date: May 27, 2015

(87) PCT Pub. No.: WO2014/087609
PCT Pub. Date: Jun. 12, 2014

(65) Prior Publication Data
US 2015/0311797 A1     Oct. 29, 2015

(30) Foreign Application Priority Data

Dec. 3, 2012  (JP) ................. 2012-264045

(51) Int. Cl.
*H02M 3/158*  (2006.01)
*H03K 17/687*  (2006.01)
(52) U.S. Cl.
CPC ......... *H02M 3/158* (2013.01); *H02M 3/1582* (2013.01); *H03K 17/6871* (2013.01); *H03K 2217/0045* (2013.01); *H03K 2217/0081* (2013.01)

(58) Field of Classification Search
CPC ............ H02M 3/1588; H02M 1/08; H02M 2001/0006; H02M 3/156; H02M 2001/0032; H02M 3/158; H02M 3/1582; H02M 7/538; H03K 17/6871; H03K 2217/0081; H03K 17/063; H03K 2217/0045
See application file for complete search history.

(56) References Cited

U.S. PATENT DOCUMENTS 5,627,460 A * 5/1997 Bazinet .................. G05F 1/618
                                                       323/224
5,914,591 A   6/1999 Yasuda et al.
(Continued)

FOREIGN PATENT DOCUMENTS

JP     10-243642     9/1998
JP     2000-166258   6/2000
(Continued)

OTHER PUBLICATIONS

International Search Report of PCT application No. PCT/JP2013/006966 dated Mar. 4, 2014.

*Primary Examiner* — Adolf Berhane
*Assistant Examiner* — Henry Lee, III
(74) *Attorney, Agent, or Firm* — McDermott Will & Emery LLP

(57) ABSTRACT

A DC-DC converter includes a switching device, a drive circuit for turning on and off the switching device, a bootstrap capacitor electrically connected to the drive circuit, and a control circuit electrically connected to the drive circuit. The control circuit is operable to charge the bootstrap capacitor for a charging duration periodically at a charging period longer than an on-off period at which the switching device is turned on and off periodically. This DC-DC converter performs efficient boost and step-down operations.

13 Claims, 11 Drawing Sheets

(56) References Cited

U.S. PATENT DOCUMENTS

| | | | |
|---|---|---|---|
| 6,256,215 B1 * | 7/2001 | Barrett | H02M 7/538 307/77 |
| 6,650,100 B1 | 11/2003 | Kohout et al. | |
| 8,558,586 B1 * | 10/2013 | Martin | G11C 7/1057 327/108 |
| 2004/0036458 A1 * | 2/2004 | Johnson | H02M 3/158 323/282 |
| 2004/0085048 A1 | 5/2004 | Tateishi | |
| 2005/0285585 A1 | 12/2005 | Noma | |
| 2007/0236199 A1 | 10/2007 | Nakata | |
| 2011/0156669 A1 * | 6/2011 | Ishii | H02M 3/1588 323/271 |
| 2012/0068682 A1 | 3/2012 | Laurent | |
| 2012/0257430 A1 * | 10/2012 | Truettner | H02M 7/487 363/131 |

FOREIGN PATENT DOCUMENTS

| | | |
|---|---|---|
| JP | 2004-048830 | 2/2004 |
| JP | 2006-014559 | 1/2006 |
| JP | 2007-282411 | 10/2007 |
| JP | 2011-239631 | 11/2011 |
| JP | 2012-029361 | 2/2012 |
| JP | 2012-513737 | 6/2012 |

* cited by examiner

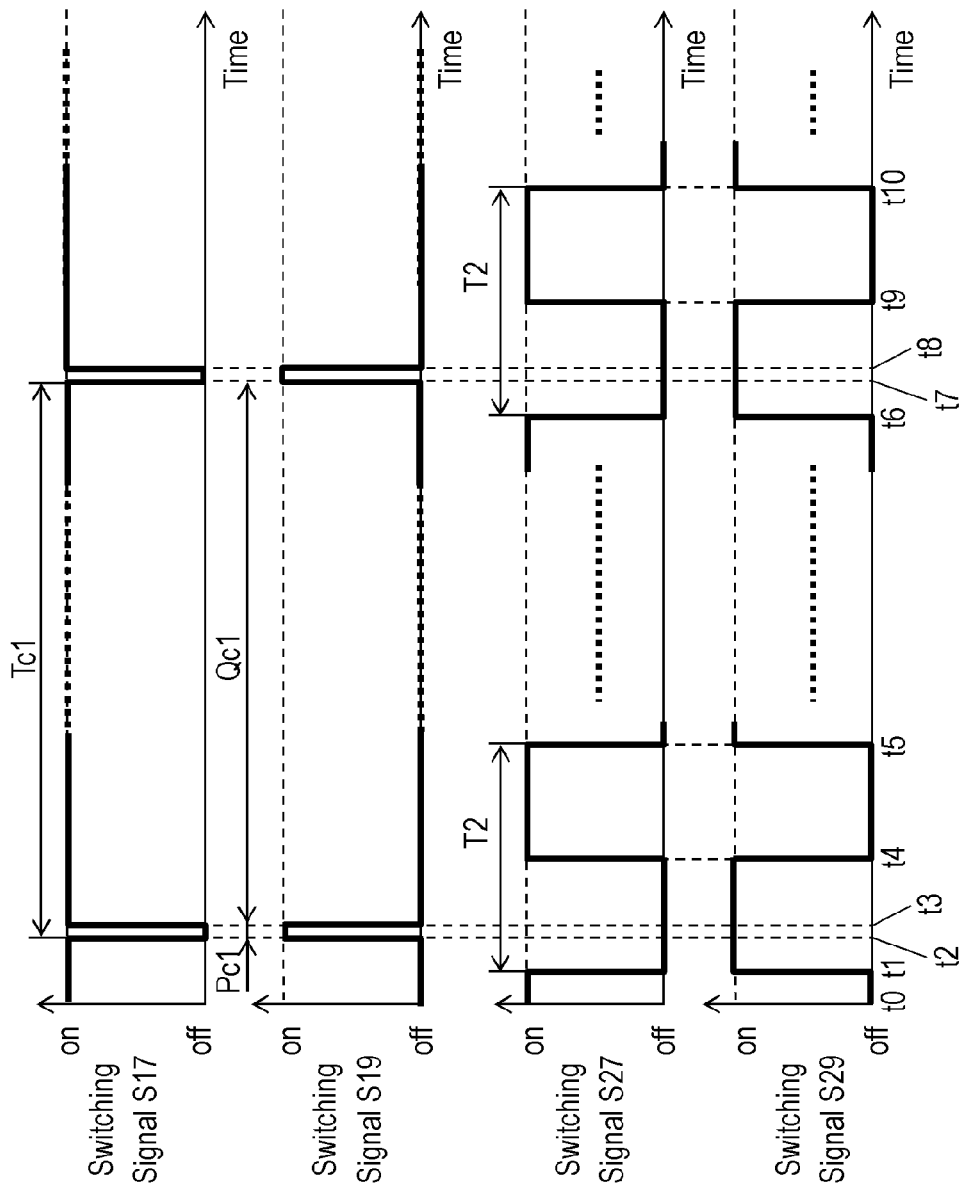

DC-DC CONVERTER

This application is a U.S. national stage application of the PCT international application No. PCT/JP2013/006966 filed on Nov. 27, 2013, which claims the benefit of foreign priority of Japanese patent application No. 2012-264045 filed on Dec. 3, 2012, the contents all of which are incorporated herein by reference.

TECHNICAL FIELD

The present invention relates to a DC-DC converter capable of stepping up and stepping down a voltage.

BACKGROUND ART

FIG. 8 is a circuit diagram of conventional power supply circuit 500 disclosed in PTL 1. Power supply circuit 500 includes buck-boost DC-DC converter 500A for stepping up or stepping down a DC voltage.

Power supply circuit 500 includes input port 103 connected to commercial power supply 101. Diode bridge 105 is connected to input port 103, and input capacitor 107 is connected in parallel to a subsequent stage of diode bridge 105. Buck-boost converter 500A is also connected to the subsequent stage of diode bridge 105.

Buck-boost converter 500A includes choke coil 109, high-side switching device 11, low-side switching device 113, diodes 115 and 117, and output capacitor 119. Both ends of output capacitor 119 function as output ports 121 of power supply circuit 500. Load 123 is connected to output ends 121.

Power supply circuit 500 includes controller 125, current detector 127, and high-side driver IC 129. Power supply circuit 500 further includes bootstrap capacitor 131 and diode 133 that constitute a bootstrap circuit.

DC driver voltage Vcc is applied to controller 125. Controller 125 generates a switching signal for turning on and off high-side switching device 111 and low-side switching device 113 so that an output current may match a target current.

In the bootstrap circuit shown in FIG. 8, bootstrap capacitor 131 is charged with DC drive voltage Vcc when both of high-side switching device 111 and low-side switching device 113 are turned off. By using this charge, a ground level of a switching signal of high-side switching device 111 is raised to secure a drive voltage to turn on high-side switching device 111.

However, in conventional power supply circuit 500, diodes 115 and 117 generate heat during operation, and cause the entire efficiency of power supply circuit 500 to degrade accordingly.

CITATION LIST

Patent Literature

PTL 1: Japanese Patent Laid-Open Publication No. 2012-29361

SUMMARY

A DC-DC converter includes a switching device, a drive circuit for turning on and off the switching device, a bootstrap capacitor electrically connected to the drive circuit, and a control circuit electrically connected to the drive circuit. The control circuit is operable to charge the bootstrap capacitor for a charging duration periodically at a charging period longer than an on-off period at which the switching device is turned on and off periodically.

This DC-DC converter performs efficient buck and boost operations.

BRIEF DESCRIPTION OF DRAWINGS

FIG. 2A is a timing chart of a boost operation of the DC-DC converter in accordance with Embodiment 1.

DETAIL DESCRIPTION OF PREFERRED EMBODIMENTS

Exemplary Embodiment 1

Figure 1:
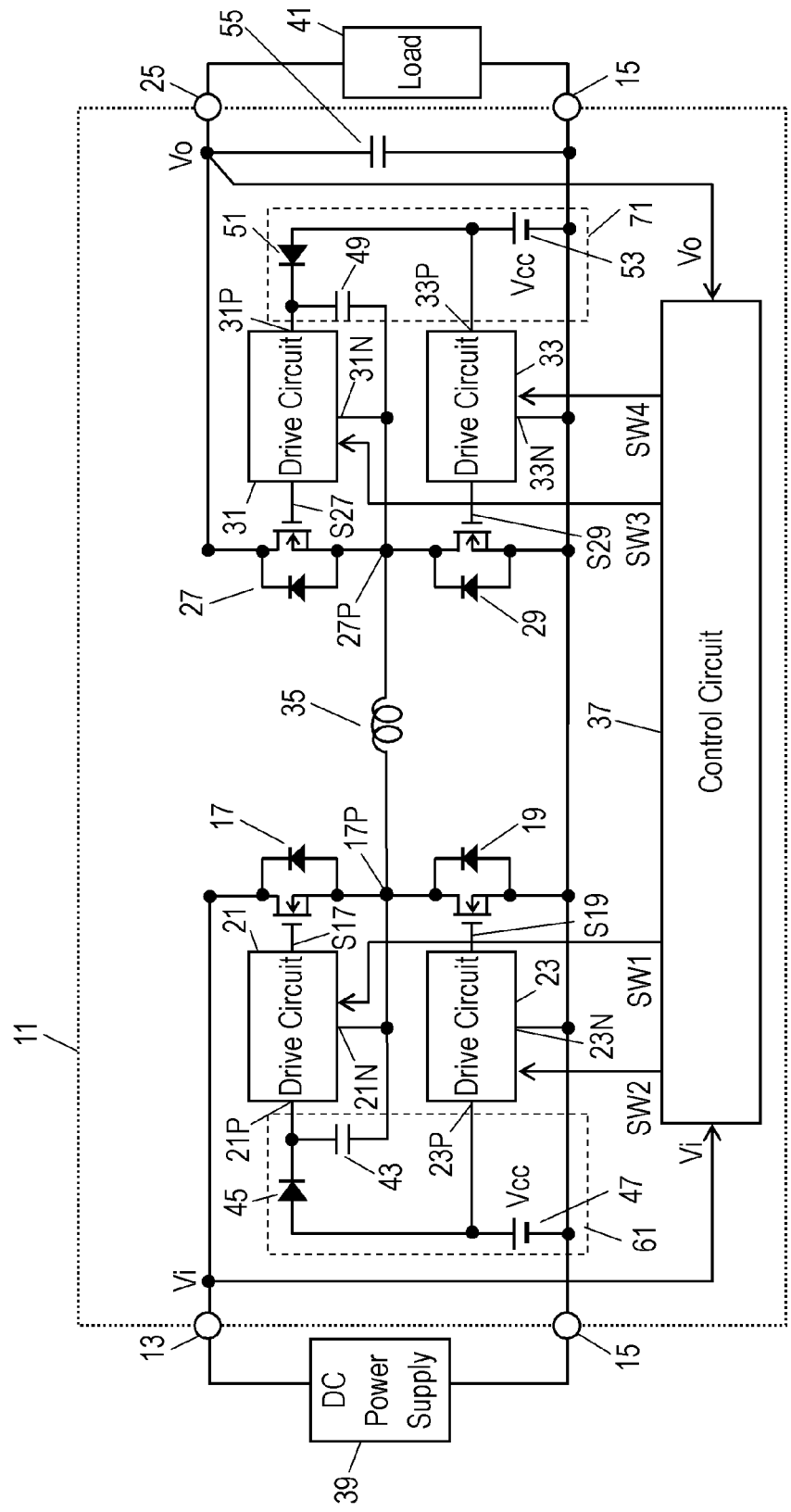
FIG. 1 is a circuit block diagram of a DC-DC converter in accordance with Exemplary Embodiment 1 of the present invention.

FIG. 1 is a circuit block diagram of DC-DC converter 11 in accordance with Exemplary Embodiment 1 of the present invention. DC-DC converter 11 is configured to output voltage Vo obtained by converting input voltage Vi. DC-DC converter 11 includes input terminal 13, ground terminal 15, switching device 17 electrically connected in series between input terminal 13 and node 17P, switching device 19 electrically connected in series to switching device 17 at node 17P and between node 17P and ground terminal 15, drive circuit 21 that turns on and off switching device 17, bootstrap capacitor circuit 61 electrically connected to drive circuit 21, and drive circuit 23 that turns on and off switching device 19. DC-DC converter 11 further includes output terminal 25, switching device 27 electrically connected in series between output terminal 25 and node 27P, switching device 29 electrically connected in series to switching device 27 at node 27P and between node 27P and ground terminal 15, drive circuit 31 that turns on and off switching device 27, bootstrap capacitor circuit 71 electrically connected to drive circuit 31, and drive circuit 33 that turns on and off switching device 29. DC-DC converter 11 further includes inductor 35 electrically connected in series between nodes 17P and 27P, and control circuit 37 electrically connected to drive circuits 21, 23, 31, and 33. Input voltage Vi is applied to input terminal 13. Output terminal 25 outputs output voltage Vo. DC-DC converter 11 is configured to convert input voltage Vi input from input terminal 13 into output voltage Vo, and to output voltage Vo from output terminal 25.

Figure 2B:
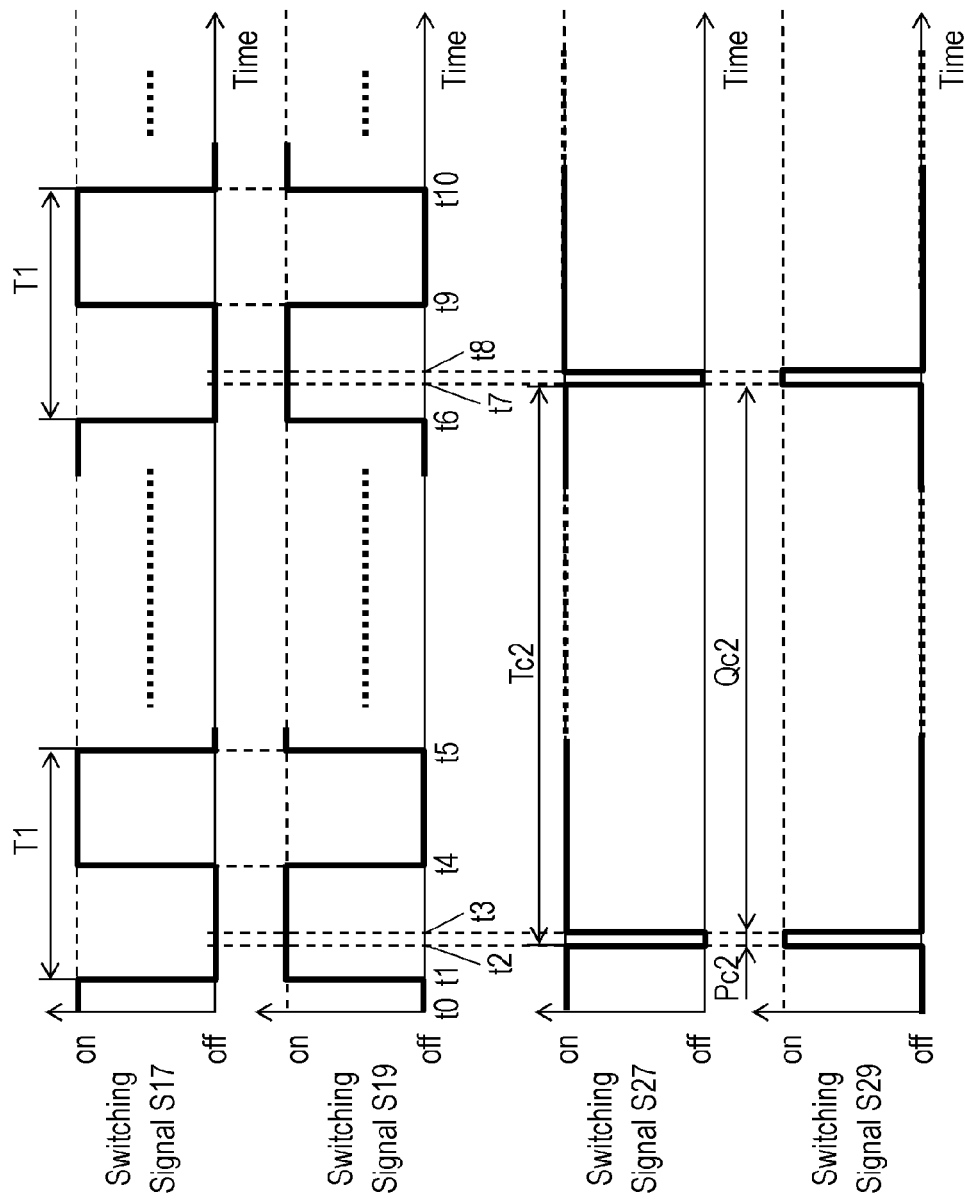
FIG. 2B is a timing chart of a buck operation of the DC-DC converter in accordance with Embodiment 1.

FIG. 2A is a timing chart illustrating a boost operation of DC-DC converter 11. FIG. 2B is a timing chart illustrating a buck operation of DC-DC converter 11. FIGS. 2A and 2B show switching signals S17, S19, S27, and S29 input to gates of switching devices 17, 19, 27, and 29, respectively. In the timing charts shown in FIGS. 2A and 2B, vertical axes represent values of switching signals S17, S19, S27, and S29, and horizontal axes represent time. Each of switching signals S17, S19, S27, and S29 takes two values, "on" and "off", corresponding to situations of turning on and off each of switching devices 17, 19, 27, and 29, respectively. When the DC-DC converter steps down input voltage Vi to convert input voltage Vi into output voltage Vo, and outputs output voltage Vo from output terminal 25, control circuit 37 is operable to turn on and off switching devices 17 and 19 periodically at on-off frequency f1, to turn off switching device 27 and turn on switching device 29 for charging duration Pc2 as to charge bootstrap capacitor 49 of bootstrap capacitor circuit 71 periodically at charging period Tc2 that is the reciprocal of charging frequency fc2 lower than on-off frequency f1, and to turn on switching device 27 and turn off switching device 29 for duration Qc2 in charging period Tc2 other than charging duration Pc2 periodically at charging period Tc2. When the DC-DC converter steps up input voltage Vi to convert input voltage Vi into output voltage Vo and outputs output voltage Vo from output terminal 25, control circuit 37 is operable to turn on and off switching devices 27 and 29 alternately and periodically at on-off frequency f2, to turn off switching device 17 and turn on switching device 19 for charging duration Pc1 as to charge bootstrap capacitor 43 of bootstrap capacitor circuit 61 periodically at charging period Tc1 that is the reciprocal of charging frequency fc1 lower than on-off frequency f2, and to turn on switching device 17 and turn off switching device 19 for duration Qc1 in charging period Tc1 other than charging duration Pc1 periodically at charging period Tc1.

Figure 8:
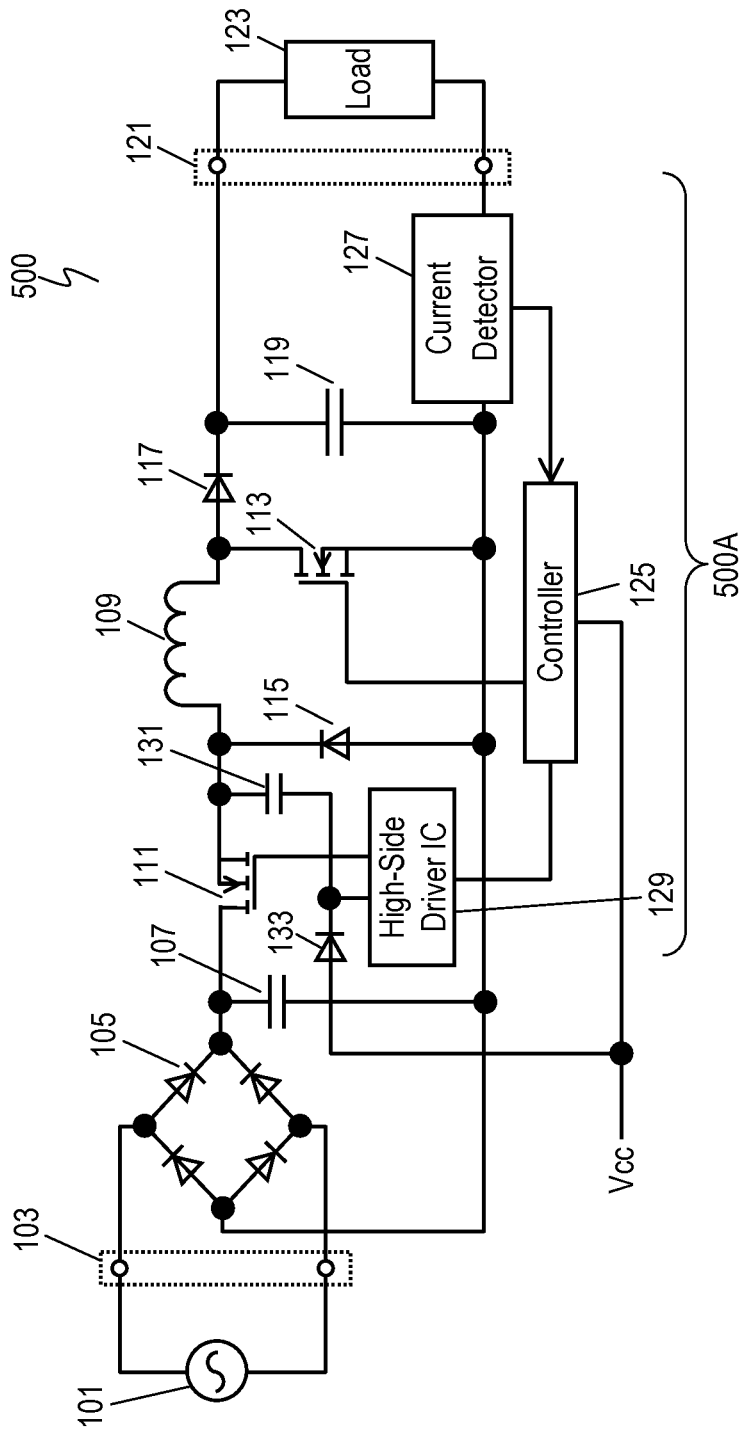
FIG. 8 is a circuit diagram of a conventional power supply circuit.

In conventional power supply circuit 500 shown in FIG. 8, diodes 115 and 117 necessary for the boost operation generate heat due to forward voltage drops during operation, degrading the entire efficiency of power supply circuit 500 accordingly.

In DC-DC converter 11 in accordance with Embodiment 1, all semiconductor devices necessary for the buck-boost operation are switching devices which do not include diodes, and scarcely produce a power loss due to forward voltage drops of the diodes. Since bootstrap capacitor circuit 71 is also connected to drive circuit 31 for switching device 27 connected to the high side, DC-DC converter 11 can perform the buck-boost operation reliably. Accordingly, DC-DC converter 11 can perform efficient buck-boost operation.

A structure and operation of DC-DC converter 11 in accordance with Embodiment 1 will be described below. In DC-DC converter 11 in accordance with Embodiment 1, direct-current (DC) power supply 39 is connected to input terminal 13. In accordance with Embodiment 1, DC power supply 39 is solar cells that output a voltage fluctuated by season, climate condition, or shadow. DC-DC converter 11 is configured to receive the voltage of DC power supply 39 as input voltage Vi, and steps up and down input voltage Vi to output constant output voltage Vo.

DC power supply 39 is electrically connected to input terminal 13 and ground terminal 15 of DC-DC converter 11. Power generated by DC power supply 39 is input to DC-DC converter 11 through input terminal 13 and ground terminal 15.

Load 41 is electrically connected to output terminal 25 and ground terminal 15 of DC-DC converter 11. Load 41 may be an electronic product that is driven by constant DC voltage output from DC-DC converter 11, or an electronic product, such as a power conditioner, driven by commercial power (e.g., alternating-current (AC) 100V power) converted by an inverter.

The structure of DC-DC converter 11 will be detailed below.

Switching devices 17 and 19 are semiconductor switching devices, and are field-effect transistors (hereafter referred to as FETs) in accordance with Embodiment 1. Switching devices 17 and 19 are not limited to FETs. As long as being turned on and off in response to external on-off signals, any of switching devices is applicable.

Drive circuit 21 for turning on and off switching device 17 is electrically connected to a gate of switching device 17 implemented by an FET. Drive circuit 21 turns on and off switching device 17 in response to switching signal SW1 output from control circuit 37.

In order to turn on switching device 17, a ground level of voltage applied to the gate of switching device 17 is raised. In DC-DC converter 11 in accordance with Embodiment 1, bootstrap capacitor circuit 61 electrically connected to drive circuit 21 raises the ground level of voltage applied to the gate of switching device 17.

Bootstrap capacitor circuit 61 includes bootstrap capacitor 43, diode 45, and drive power supply 47. A positive terminal of drive power supply 47 is electrically connected to positive power supply terminal 21P of drive circuit 21 via diode 45 to activate drive circuit 21. Negative power supply terminal 21N of drive circuit 21 is electrically connected to node 17P at which switching devices 17 and 19 are connected. Accordingly, the ground level of drive circuit 21 becomes a voltage at node 17P. Bootstrap capacitor 43 is electrically connected between positive power supply terminal 21P and negative power supply terminal 21N of drive circuit 21. Accordingly, when switching device 17 is turned on, a maximum voltage of the ground level (node 17P) becomes input voltage Vi. In order to continuously turn on switching device 17, power stored in bootstrap capacitor 43 is supplied to drive circuit 21. A voltage provided by adding a voltage of bootstrap capacitor 43 to the ground level, i.e., the voltage at node 17P, is supplied to positive power supply terminal 21P of drive circuit 21.

Drive circuit 23 for turning on and off switching device 19 is electrically connected to a gate of switching device 19 implemented by an FET. Drive circuit 23 turns on and off switching device 19 based on switching signal SW2 output from control circuit 37. Since negative power supply terminal 23N of drive circuit 23 is electrically connected to ground terminal 15, drive circuit 23 is always driven by drive voltage Vcc from drive power supply 47. Accordingly, a bootstrap capacitor circuit is not connected to drive circuit 23.

Switching devices 27 and 29 are semiconductor switching devices, and they are FETs in DC-DC converter 11 in accordance with Embodiment 1. However, switching devices 27 and 29 are not limited to FETs. As long as the switching operation is feasible based on external on-off signals, any semiconductor switching device is applicable.

Drive circuit 31 for turning on and off switching device 27 is electrically connected to a gate of switching device 27 implemented by an FET. Drive circuit 31 turns on and off switching device 27 in response to switching signal SW3 output from control circuit 37.

In order to turn on switching device 27, a ground level of voltage applied to the gate of switching device 27 is raised. In DC-DC converter 11 in accordance with Embodiment 1, bootstrap capacitor circuit 71 electrically connected to drive circuit 31 raises the ground level of voltage applied to the gate of switching device 27.

Bootstrap capacitor circuit 71 includes bootstrap capacitor 49, diode 51, and drive power supply 53. A positive terminal of drive power supply 53 is electrically connected to positive power supply terminal 31P of drive circuit 31 via diode 51 to activate drive circuit 31. Negative power supply terminal 31N of drive circuit 31 is electrically connected to node 27P at which switching devices 27 and 29 are connected. Accordingly, the ground level of drive circuit 31 becomes a voltage at node 27P. Bootstrap capacitor 49 is electrically connected between positive power supply terminal 31P and negative power supply terminal 31N of drive circuit 31. Accordingly, when switching device 27 is turned on, a maximum voltage of the ground level (node 27P) becomes output voltage Vo. In order to continuously turn on switching device 27, power stored in bootstrap capacitor 49 is supplied to drive circuit 31. A voltage obtained by adding a voltage of bootstrap capacitor 49 to a voltage of the ground level, i.e., a voltage at node 27P, is supplied to positive power supply terminal 31P of drive circuit 31.

In DC-DC converter 11 in accordance with Embodiment 1, drive power supplies 47 and 53 are separate power supplies. Therefore, even if the switching operation of a switching device becomes not feasible due to a problem with one of drive power supplies 47 and 53, the switching operation of a switching device is feasible by a drive circuit connected to the other, normal drive power supply. As a result, if one drive power supply breaks down, control circuit 37 controls the turning off of a switching device (switching device 17 or 27) at the high side by the drive circuit connected to the normal drive power supply, so as to stop output from DC-DC converter 11, thus improving reliability.

A gate of switching device 29 implemented by an FET is electrically connected to drive circuit 33 for turning on and off switching device 29. Drive circuit 33 turns on and off switching device 29 in response to switching signal SW4 output from control circuit 37. Since negative power supply terminal 33N of drive circuit 33 is also electrically connected to ground terminal 15, similarly to drive circuit 23, drive circuit 33 can always be driven with drive voltage Vcc. Accordingly, a bootstrap capacitor circuit is not connected to drive circuit 33 either.

Inductor 35 is electrically connected between node 17P at which switching devices 17 and 19 are connected to each other and node 27P at which switching devices 27 and 29 are connected to each other.

Control circuit 37 is electrically connected to drive circuits 21, 23, 31, and 33. Control circuit 37 includes a microcomputer and peripheral circuit as to control drive circuits 21, 23, 31, and 33 to turn on and off switching devices 17 19, 27, and 29. Control circuit 37 is also electrically connected to input terminal 13 and output terminal 25 to detect input voltage Vi and output voltage Vo.

Smoothing capacitor 55 is electrically connected between output terminal 25 and ground terminal 15.

An operation of DC-DC converter 11 will be described below.

An operation of DC-DC converter 11 steps up input voltage Vi to output predetermined output voltage Vo in the case that input voltage Vi output from DC power supply 39 is low will be first described.

In the DC-DC converter in accordance with Embodiment 1 shown in FIG. 1, in the case that the DC-DC converter steps up input voltage Vi to predetermined output voltage Vo and output voltage Vo from output terminal 25, that is, in the case that output voltage Vo is higher than input voltage Vi, control circuit 37 basically turns on and off switching devices 27 and 29 alternately and periodically at on-off frequency f2 while continuously turning on switching device 17 and turning off switching device 19. Switching devices 27 and 29 are alternately turned on and off in on-off period T2, the reciprocal of on-off frequency f2, at a duty determined by control circuit 37. In accordance with Embodiment 1, on-off frequency f2 is 100 kHz. On-off frequency f2 is not limited to 100 kHz. A different value may be determined as appropriate, as long as predetermined power specifications are satisfied.

The above operation will be described with reference to FIG. 2A.

As shown in FIG. 2A, when switching device 27 is turned on at time point t0, switching device 29 is in an opposite status, turned off. At time point t1, the on-off statuses of switching devices 27 and 29 are reversed to each other.

Then, at time point t4, the on-off statuses of switching devices 27 and 29 are reversed again to become the status from time point t0 to time point t1. Then, at time point t5, the on-off statuses of switching devices 27 and 29 are reversed again.

A duration from time point t1 to time point t5 is one on-off period T2 (10 microseconds in accordance with Embodiment 1). The on-off operation of switching devices 27 and 29 is repeated from time point t6 to time point t10, for example, and switching devices 27 and 29 are alternately turned on and off periodically at on-off frequency f2. In the timing chart shown in FIG. 2A, the duty of the on-off operation of switching devices 27 and 29 is 50%.

An operation of the DC-DC converter charging bootstrap capacitor 43 will be described below. As described above, power for activating drive circuit 21 is supplied from power stored in bootstrap capacitor 43. Control circuit 37 controls switching device 17 to continuously turn on switching device 17 in the boost operation. Accordingly, drive circuit 21 outputs the gate voltage as signal S17, so as to continuously turn on switching device 17. As a result, the power stored in bootstrap capacitor 43 for activating drive circuit 21 decreases with a lapse of time. In order to prevent the power stored in bootstrap capacitor 43 from decreasing, control circuit 37 periodically charges bootstrap capacitor 43.

More specifically, as shown in FIG. 2A, control circuit 37 continuously turns on switching device 17 and continuously turns off switching device 19 from time point t0 to time point t2. Control circuit 37 controls switching devices 17 and 19 to charge bootstrap capacitor 43 for charging duration Pc1 periodically at charging period Tc1 (1 millisecond in accordance with Embodiment 1) previously calculated based on capacitance C1 of bootstrap capacitor 43 and power consumption in drive circuit 21. In other words, as shown in FIG. 2A, control circuit 37 turns off switching device 17 and turns on switching device 19 at time point t2 reaching charging period Tc1. Since one end of bootstrap capacitor 43 is connected to the negative terminal of drive power supply 47, bootstrap capacitor 43 is charged by this operation. Accordingly, unlike conventional power supply circuit 500 shown in FIG. 8 including a diode instead of switching device 19, bootstrap capacitor 43 is charged efficiently regardless of the on-off status of switching device 29.

At time point t3 at which after charging duration Pc1 passes from time point t2, control circuit 37 returns switching devices 17 and 19 to turn on switching device 17 and turn off switching device 19. As a result, DC-DC converter 11 continues the boost operation from time point t3. Charging duration Pc1 is predetermined based on capacitance C1 of bootstrap capacitor 43. In accordance with Embodiment 1, charging duration Pc1 is 1 microsecond.

After charging bootstrap capacitor 43, the above operation is executed again at time point t7 at which charging period Tc1 passes from time point t2. By repeating these operations, control circuit 37 charges bootstrap capacitor 43 for charging duration Pc1 (1 microsecond in the accordance with Embodiment 1) periodically at charging period Tc1 (1 millisecond in accordance with Embodiment 1).

As shown in FIG. 2A, charging frequency fc1 (1 kHz in accordance with Embodiment 1), the reciprocal of charging period Tc1, is lower than on-off frequency f2 (100 kHz in accordance with Embodiment 1), the reciprocal of on-off period T2 (10 microsecond in accordance with Embodiment 1). Therefore, switching device 17 is turned on and switching device 19 is turned off for a duration from time point t3 to time point t7. In this duration, switching devices 27 and 29, as shown in FIG. 2A, continue to repeat on-off operations periodically at on-off frequency f2, the reciprocal of on-off period T2. In order to reduce fluctuation of output voltage Vo, bootstrap capacitor 43 that stores the power for activating drive circuit 21 to turn on and off switching device 17 is preferably charged while switching device 27 is turned off. More specifically, charging duration Pc1 of bootstrap capacitor 43 is preferably completely included in a duration for which switching device 27 is turned off.

Through this operation, DC-DC converter 11 can perform the boost operation while charging bootstrap capacitor 43. Since switching device 27 is an FET having a low on-resistance, accordingly reducing a loss due to a diode in a conventional converter. Accordingly, degradation of efficiency of DC-DC converter 1 can be suppressed.

As described above, when the DC-DC converter steps up input voltage Vi and outputs the stepped-up voltage from output terminal 25, control circuit 37 turns off switching device 17 and turns on switching device 19 for charging duration Pc1 as to charge bootstrap capacitor 43 periodically at charging period Tc1 determined by charging frequency fc1 lower than on-off frequency f2 of switching devices 27 and 29. For duration Qc other than charging duration Pc1, control circuit 37 turns on switching device 17 and turns off switching device 19 so as not to charge bootstrap capacitor 43.

Next, the buck operation of DC-DC converter 11 will be described below. DC-DC converter 11 operates to buck input voltage Vi to predetermined output voltage Vo when, for example, DC power supply 39, solar cells, outputs full power.

In the buck operation, control circuit 37 basically turns on and off switching devices 17 and 19 alternately while continuously turning on switching device 27 and continuously turning off switching device 29.

In the above operation, bootstrap capacitor 49 of bootstrap capacitor circuit 71 is periodically charged in order to continuously turn on switching device 27. This operation is substantially identical to the operation for periodically charging bootstrap capacitor 43 of bootstrap capacitor circuit 61 during the boost operation.

In the case that input voltage Vi is stepped down to predetermined output voltage Vo output from output terminal 25, that is, in the case that output voltage Vo is lower than input voltage Vi, the DC-DC converter in accordance with Embodiment 1 shown in FIG. 1 basically turns on and off switching devices 17 and 19 alternately and periodically at on-off frequency f1 while continuously turns on switching device 27 and continuously turning off switching device 29. Accordingly, switching devices 17 and 19 are turned on and off alternately in on-off period T1, the reciprocal of on-off frequency f1, at a duty determined by control circuit 37. In accordance with Embodiment 1, on-off frequency f1 is 100 kHz. However, on-off frequency f1 is not limited to 100 kHz. As long as predetermined power specifications are fulfilled, any other values can be applicable.

The above operation will be described with reference to FIG. 2B.

As shown in FIG. 2B, at time point t0 when switching device 17 is turned on, switching device 19 is turned off, in the opposite status. At time point t1, the on-off statuses of switching devices 17 and 19 are reversed.

Then, at time point t4, the on-off statuses of switching devices 17 and 19 are reversed again and become the statuses identical to the status from time point t0 to time point t1. Then, at time point t5, the on-off statuses of switching devices 17 and 19 are reversed again.

A duration from time point t1 to time point t5 is one on-off period T1 (10 microseconds in accordance with Embodiment 1), and the on-off operations of switching devices 17 and 19 are repeated, similarly to the operation from time point t6 to time point t10. Switching devices 17 and 19 are turned on and off periodically at on-off frequency f1. A duty of switching devices 17 and 19 is 50% in the timing chart shown in FIG. 2B.

Next, an operation of charging bootstrap capacitor 49 will be described below. As described above, power for activating drive circuit 31 is supplied from the power stored in bootstrap capacitor 49. Control circuit 37 controls switching device 27 to continuously turn on switching device 27 on during the buck operation. Accordingly, drive circuit 31 outputs a gate voltage as signal S27 to continuously turn on switching device 27. As a result, the power stored in bootstrap capacitor 49 for activating drive circuit 21 decreases with a lapse of time. In order to prevent the power stored in bootstrap capacitor 49 from decreasing, control circuit 37 periodically charges bootstrap capacitor 49.

More specifically, as shown in FIG. 2B, control circuit 37 continuously turns on switching device 27 and turns off switching device 28 from time point t0 to time point t2. Control circuit 37 controls switching devices 27 and 29 to charge bootstrap capacitor 49 for charging duration Pc2 periodically at charging period Tc2 (1 millisecond in accordance with Embodiment 1) predetermined based on capacitance C2 of bootstrap capacitor 49 and power consumption in drive circuit 31. More specifically, as shown in FIG. 2B, control circuit 37 controls switching devices 27 and 29 to turn off switching device 27 and turn on switching device 29 at time point t2 reaching charging period Tc2. This operation allows one terminal of bootstrap capacitor 49 connected to the negative terminal of drive power supply 53, and thus, bootstrap capacitor 49 is charged. Bootstrap capacitor 49 can thus be charged efficiently regardless of the on-off status of switching device 19.

At time point t3 at which charging duration Pc passes from time point t2, control circuit 37 returns switching devices 27 and 29 to turn on switching device 27 and turn off switching device 29. As a result, DC-DC converter 11 continues the buck operation from time point t3. Charging duration Pc2 is predetermined based on capacitance C2 of bootstrap capacitor 49. In accordance with Embodiment 1, charging duration Pc2 is 1 microsecond.

After charging bootstrap capacitor 49, the above operation is repeated at time point t7 at which charging period Tc2 passes from time point t2. By repeating these operations, control circuit 37 charges bootstrap capacitor 49 for charging duration Pc2 (1 microsecond in accordance with Embodiment 1) periodically at charging period tc2 (1 millisecond in accordance with Embodiment 1).

As shown in FIG. 2B, charging frequency fc2 (1 kHz in accordance with Embodiment 1), is the reciprocal of charging period Tc2, is lower than on-off frequency f1 (100 kHz in accordance with Embodiment 1), the reciprocal of on-off period T1 (10 microsecond in accordance with Embodiment 1). Therefore, switching device 27 is continuously turned on and switching device 29 is continuously turned off for a duration from time point t3 to time point t7. In this duration, switching devices 17 and 19, as shown in FIG. 2B, continue to repeat the on-off operation at on-off frequency f1 (100 kHz in accordance with Embodiment 1), the reciprocal of on-off period T1. In order to reduce fluctuation of output voltage Vo, bootstrap capacitor 49 which stores power for activating drive circuit 31 to turn on and off switching device 27 is preferably charged while switching device 17 is turned off. More specifically, charging duration Pc2 of bootstrap capacitor 49 is preferably completely included in a duration for which switching device 27 is turned off.

With this operation, DC-DC converter 11 can perform the buck operation while charging bootstrap capacitor 49. Switching device 17, being implemented by an FET having a low on resistance, reduces a loss due to a diode in the conventional converter. Accordingly, degradation of efficiency of DC-DC converter 11 can be suppressed.

As described above, when the DC-DC converter steps down input voltage Vi to output the stepped down voltage from output terminal 25, control circuit 37 turns off switching device 27 and turns on switching device 29 for charging duration Pc2 for charging bootstrap capacitor 49 periodically at charging period Tc2 determined by charging frequency fc1 lower than on-off frequency f1 of switching devices 17 and 19. For duration Qc2 other than charging duration Pc2, control circuit 37 turns on switching device 27 and turns off switching device 29 so as not to charge boost strap capacitor 49.

In accordance with Embodiment 1, charging period Tc1 and charging period Tc2 are identical to each other (1 millisecond), and thus, charging frequency fc1 and charging frequency fc2, their reciprocals, are also identical to each other (1 kHz). Further, since on-off period T2 and on-off period T1 are identical to each other (10 microseconds), on-off frequency f2 and on-off frequency f1, their reciprocals, are also identical to each other (100 kHz). Charging duration Pc1 and charging duration Pc2 are also identical to each other (1 microsecond).

Accordingly, in the buck operation, DC-DC converter 11 also operates similarly to the boost operation except that the switching devices operating differently.

In accordance with Embodiment 1, capacitance Cf of smoothing capacitor 55 is larger than capacitance C1 of bootstrap capacitor 43 of bootstrap capacitor circuit 61 and capacitance C2 of bootstrap capacitor 49 of bootstrap capacitor circuit 71. Output voltage Vo temporarily fluctuates for charging duration Pc1 when bootstrap capacitor 43 is charged or for charging duration Pc2 when bootstrap capacitor 49 is charged. However, capacitance Cf of smoothing capacitor 55 larger than capacitance C1 of bootstrap capacitor 43 and capacitance C2 of bootstrap capacitor 49 reduces the amount of the fluctuation of output voltage Vo, accordingly stabilizing output voltage Vo applied to load 41. However, capacitance Cf of smoothing capacitor 55 is not necessarily larger than capacitance C1 of bootstrap capacitor 43 and capacitance C2 of bootstrap capacitor 49. For example, if load 41 is an electric storage device, such as a battery or capacitor, having a large capacity, the load can absorb the fluctuation of output voltage Vo, and thus fluctuation will not be a concern. In this case, capacitance Cf of smoothing capacitor 55 may be smaller than capacitance C1 of bootstrap capacitor 43 and capacitance C2 of bootstrap capacitor 49. Alternatively, DC-DC converter 11 may not include smoothing capacitor 55.

In DC-DC converter 11 in accordance with Embodiment 1, high-side switching devices (switching devices 17 and 27) are implemented by FETs. Therefore, if a sudden drop in output voltage Vo due to, e.g. short-circuiting of load 41, is detected, control circuit 37 may turn off both of the high-side switching devices. This operation can stop output of power from input terminal 13 via two routes, thereby providing high reliability. However, the operation of control circuit 37 is not limited to this operation. Control circuit 37 may stop either one of the high-side switching devices in the case that short-circuiting occurs.

With the above configuration and operations, a lower power loss than the power loss of diodes due to the on-resistance of the diodes is realized because all semiconductor devices are switching devices substituting for diodes for the buck-boost operation in DC-DC converter 11 in accordance with Embodiment 1. Bootstrap capacitor circuits 61 and 71 connected to drive circuits 21 and 31 of switching devices 17 and 27 connected to the high side can thus reliably execute the buck-boost operation. Accordingly, DC-DC converter 11 can efficiently execute the buck-boost operation.

As described above, control circuit 37 of DC-DC converter 11 is operable as follows in the case that output voltage Vo is lower than input voltage Vi. Control circuit 37 controls drive circuits 21 and 23 to turn on and off switching devices 17 and 19 alternately and periodically at on-off period T1. Control circuit 37 controls drive circuits 31 and 33 to turn off switching device 27 and turn on switching device 29 so as to charge bootstrap capacitor 49 for charging duration Pc2 periodically at charging period Tc2 longer than on-off period T1. Control circuit 37 controls drive circuits 31 and 33 to turn on switching device 27 and turn off switching device 29 for duration Qc2 in charging period Tc2 other than charging duration Pc2 periodically at charging period Tc2.

On the other hand, control circuit 37 of DC-DC converter 11 is operable as follows in the case that output voltage Vo is higher than input voltage Vi. Control circuit 37 controls drive circuits 31 and 33 to turn on and off switching devices 27 and 29 alternately and periodically at on-off period T2. Control circuit 37 controls drive circuits 21 and 23 to turn off switching device 17 and turn on switching device 19 for charging duration Pc1 periodically at charging period Tc1 longer than on-off period T2. Control circuit 37 controls drive circuits 21 and 23 to turn on switching device 17 and turn off switching device 19 for duration Qc1 in charging period Tc other than charging duration Pc1 periodically at charging period Tc.

On-off period T1 may be identical to on-off period T2.

Bootstrap capacitor 43 may be connected between node 17P and power supply terminal 212P of drive circuit 21. Bootstrap capacitor 49 may be connected between node 27P and power supply terminal 31P of drive circuit 31. In these cases, bootstrap capacitor circuit 61 further includes drive power supply 47 connected to power supply terminal 23P of drive circuit 23 and diode 45 connected between power supply terminal 23P of drive circuit 23 and power supply terminal 21P of drive circuit 21. Bootstrap capacitor circuit 71 further includes drive power supply 53 connected to power supply terminal 33P of drive circuit 33 and diode 51 connected between power supply terminal 33P of drive circuit 33 and power supply terminal 31P of drive circuit 31.

Figure 3:
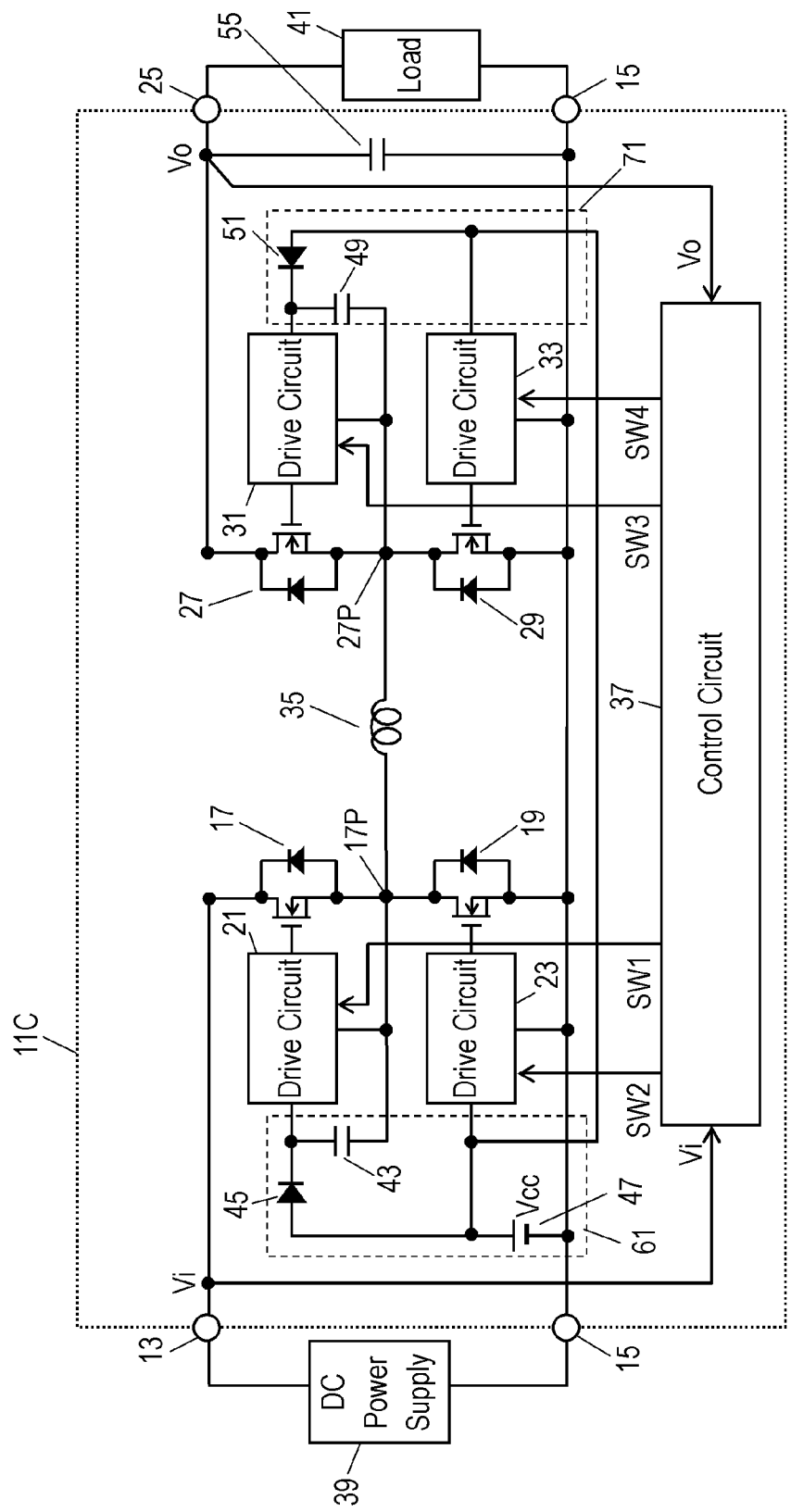
FIG. 3 is a circuit block diagram of another DC-DC converter in accordance with Embodiment 1.

FIG. 3 is a circuit block diagram of another DC-DC converter 11C in accordance with Embodiment 1. In FIG. 3, components identical to those of DC-DC converter 11 shown in FIG. 1 are denoted by the same reference numerals.

DC-DC converter 11 shown in FIG. 1 includes separate drive power supplies 47 and 53. In DC-DC converter 11C shown in FIG. 3, drive power supply 47 supplies power to drive circuits 31 and 33, instead of drive power supply 53. In this case, a circuit configuration will be simpler, and thus DC-DC converter 11C is applicable to purposes where not so high reliability is required and an environmental change is gentle (e.g., DC-DC converter installed indoor). Accordingly, either configuration may be determined for the drive power supply based on required reliability and complexity of circuit configuration.

Exemplary Embodiment 2

Figure 4:
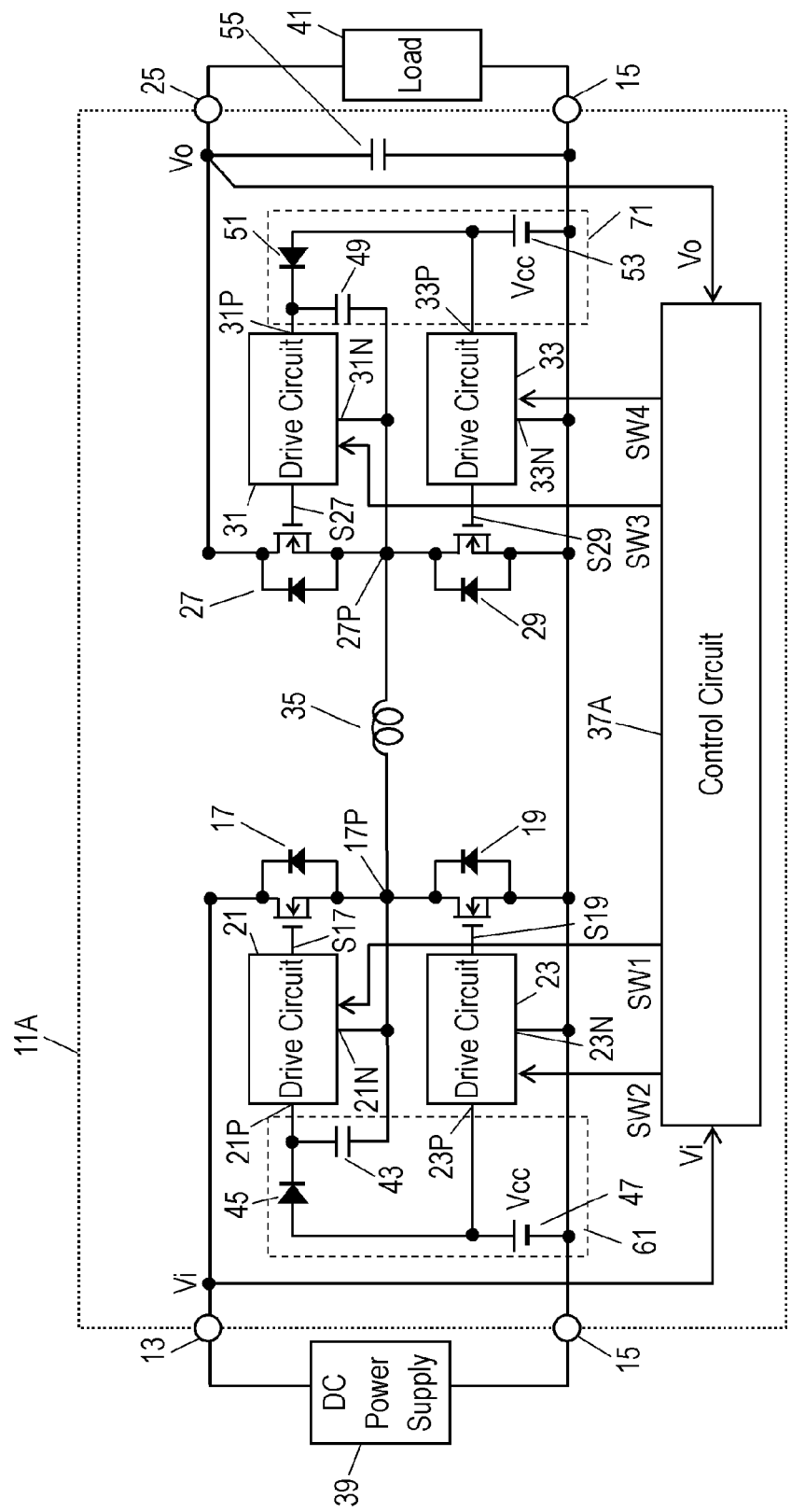
FIG. 4 is a circuit block diagram of a DC-DC converter in accordance with Exemplary Embodiment 2 of the present invention.

FIG. 4 is a circuit block diagram of DC-DC converter 11A in accordance with Exemplary Embodiment 2 of the present invention. In FIG. 4, components identical to those of DC-DC converter 11 in accordance with Embodiment 1 shown in FIG. 1 are denoted by the same reference numerals.

DC-DC converter 11A in accordance with Embodiment 2 includes control circuit 37A electrically connected to drive circuits 21, 23, 31, and 33 instead of control circuit 37 of DC-DC converter in accordance with Embodiment 1 shown in FIG. 1. In DC-DC converter 11 in accordance with Embodiment 1, capacitance C1 of bootstrap capacitor 43 of bootstrap capacitor circuit 61 is identical to capacitance C2 of bootstrap capacitor 49 of bootstrap capacitor circuit 71. In DC-DC converter 11A in accordance with Embodiment 2, capacitance C1A of bootstrap capacitor 43 of bootstrap capacitor circuit 61 is smaller than capacitance C2A of bootstrap capacitor 49 of bootstrap capacitor circuit 71.

Capacitance C2A of bootstrap capacitor 49 for the buck operation is relatively large. However, since the absolute value of output voltage Vo is reduced by the buck operation, the absolute value of a fluctuation of output voltage Vo is small even if more time is spent for charging bootstrap capacitor 49. Influence of this fluctuation is thus small on load 41. In addition, since capacitance C2A of bootstrap capacitor 49 is relatively large, bootstrap capacitor 49 can be charged less frequently, and extend a time for which output voltage Vo is stabilized.

An operation of DC-DC converter 11A in accordance with Embodiment 2 will be described below. In accordance with Embodiment 2, on-off periods T1 and T2 are identical to each other, and thus identical to on-off periods T1 and T2 in accordance with Embodiment 1.

The basic operation of DC-DC converter 11A in accordance with Embodiment 2 is the same as the operation of DC-DC converter 11 in accordance with Embodiment 1 shown in FIG. 2A. Accordingly, highly-efficient DC-DC converter 11A is achieved by employing FETs as all the switching devices. Since capacitance C1A of bootstrap capacitor 43 and capacitance C2A of bootstrap capacitor 49 are different from each other in the DC-DC converter 11A in accordance with Embodiment 2, charging timing and duration of bootstrap capacitor 43 are different from those of bootstrap capacitor 49.

Capacitance C1A of bootstrap capacitor 43 in accordance with Embodiment 2 is identical to capacitance C1 of bootstrap capacitor 43 in accordance with Embodiment 1. Capacitance C2A of bootstrap capacitor 49 in accordance with Embodiment 2 is twice capacitance C1A (C1).

Figure 5A:
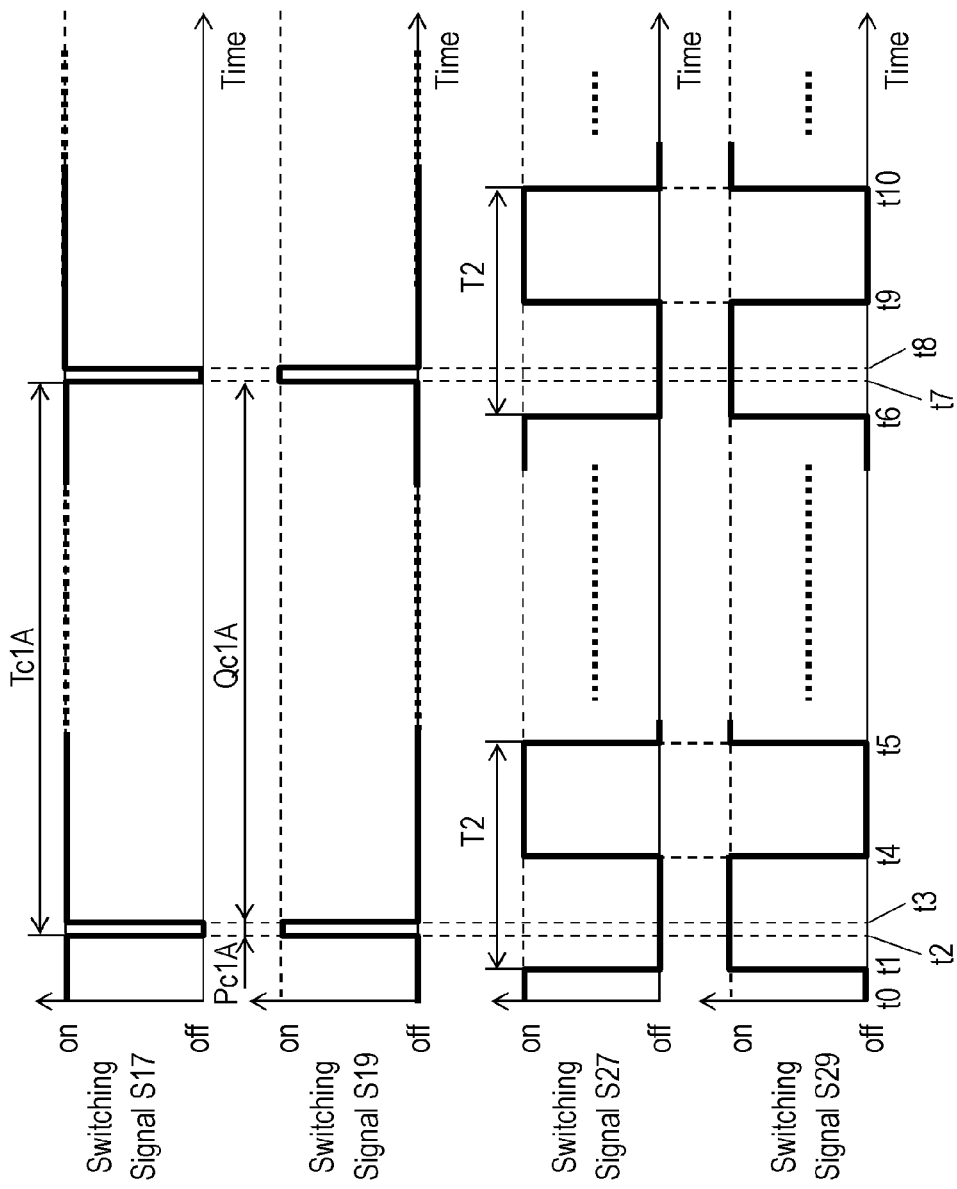
FIG. 5A is a timing chart of a boost operation of the DC-DC converter in accordance with Embodiment 2.

A boost operation of DC-DC converter 11A in accordance with Embodiment 2 will be described below. FIG. 5A is a timing chart for illustrating the boost operation of DC-DC converter 11A. In the timing chart shown in FIG. 5A, vertical axes represent values of switching signals S17, S19, S27, and S29, and horizontal axes represent time. Each of switching signals S17, S19, S27, and S29 takes two values, on and off, corresponding to the on and off statuses of each of switching devices 17, 19, 27, and 29, respectively. Since capacitance C1A of bootstrap capacitor 43 in accordance with Embodiment 2 is identical to capacitance C1 of bootstrap capacitor 43 in accordance with Embodiment 1, charging period Tc1A and charging duration Pc1A of bootstrap capacitor 43 in accordance with Embodiment 2 are identical to charging period Tc1 and charging duration Pc1 in accordance with Embodiment 1 in the boost operation, respectively. Accordingly, the boost operation shown in FIG. 5A in accordance with Embodiment 2 is identical to the boost operation shown in FIG. 2A of DC-DC converter 11 in accordance with Embodiment 1.

Figure 5B:
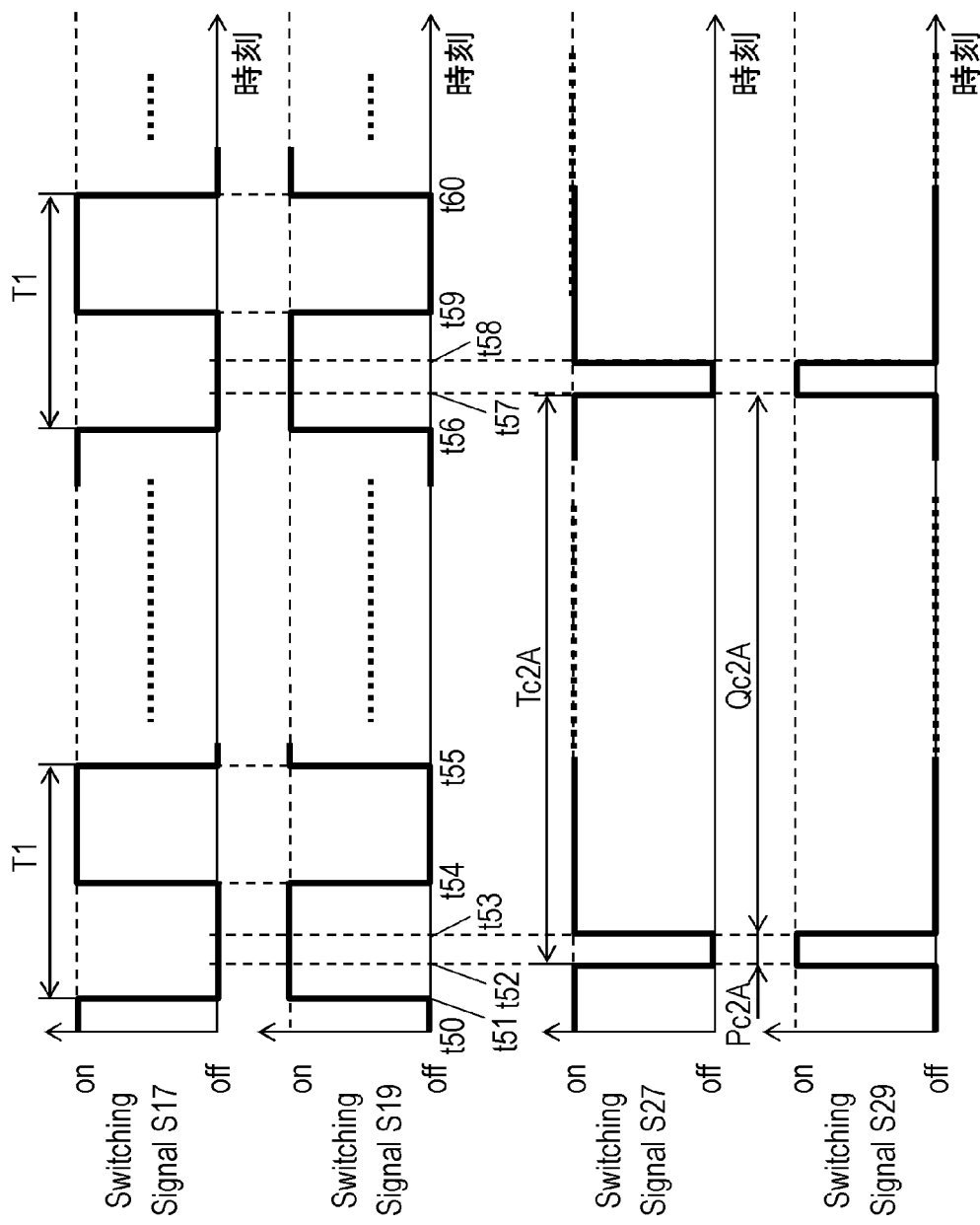
FIG. 5B is a timing chart of a buck operation of the DC-DC converter in accordance with Embodiment 2.

A step-down operation of DC-DC converter 11A in accordance with Embodiment 2 will be described below. FIG. 5B is a timing chart illustrating the step-down operation of DC-DC converter 11A. In the timing chart shown FIG. 5B, vertical axes represent values of switching signals S17. S19, S27, and S29, and horizontal axes represent time. As described above, capacitance C2A of bootstrap capacitor 49 is twice capacitance C1A of bootstrap capacitor 43, and thus, charging duration Pc2A for which bootstrap capacitor 49 having capacitance C2A is charged in the step-down operation is twice charging duration Pc1A, 2 microseconds, for which bootstrap capacitor 43 having capacitance C1A is charged in the boost operation. A duration for which power is supplied to drive circuit 31 can be extended since capacitance C2A of bootstrap capacitor 49 is large. A charging frequency of bootstrap capacitor 49 can thus be reduced. In accordance with Embodiment 2, charging period Tc2A at which bootstrap capacitor 49 is charged can be long, 2 milliseconds, which is twice charging period Tc1A for charging bootstrap capacitor 43. Accordingly, in the step-down operation, DC-DC converter 11A in accordance with Embodiment 2, control circuit 37A is operable to allow charging duration PC2A and charging period Tc2A of bootstrap capacitor 49 to be longer than charging duration Pc2 and charging period Tc2 of bootstrap capacitor 49 of DC-DC converter 11, respectively, so as to allow bootstrap capacitor 49 to be charged less frequently.

Since this operation increase charging duration Pc2A, a duration for which output voltage Vo fluctuates increases accordingly. However, since the absolute value of output voltage Vo in the step-down operation is small, the absolute value of the fluctuation of output voltage Vo for charging duration Pc2 also become small. Accordingly, DC-DC converter 11A in accordance with Embodiment 2 can drive load 41 normally if load 41 connected to output terminal 25 and ground terminal 15 is unlikely affected by the absolute value of the fluctuation of output voltage Vo.

The above operation can allows bootstrap capacitor 49 to be charged less frequently since capacitance C2A of bootstrap capacitor 49 is large. As a result, charging period Tc2A becomes longer, and accordingly, increases a duration for which output voltage Vo is stabilized.

Thus, capacitance C1A of bootstrap capacitor 43 smaller than capacitance C2A of bootstrap capacitor 49 stabilizes output voltage Vo in the step-down operation.

Contrarily, if capacitance C1A of bootstrap capacitor 43 is larger than capacitance C2A of bootstrap capacitor 49, charging duration Pc1A in the boost operation increases, and thus, the absolute value of the fluctuation of output voltage Vo for this duration become large. This increases a voltage fluctuation for charging duration pc1A although bootstrap capacitor 43 is charged less frequently. This is not unpreferable As described above, control circuit 37A of DC-DC converter 11A in accordance with Embodiment 2 is operable as follows in the case that output voltage Vo is lower than input voltage Vi. Control circuit 37A controls drive circuits 21 and 23 to turn on and off switching devices 17 and 19 alternately and periodically at on-off period T1. Control circuit 37A controls drive circuits 31 and 33 to turn off switching device 27 and turn on switching device 29 so as to charge bootstrap capacitor 49 for charging duration Pc2 periodically at charging period Tc longer than on-off period T1. Control circuit 37A controls drive circuits 31 and 33 to turn on switching device 27 and turn off switching device 29 for duration Qc2A in charging period Tc2A other than charging duration Pc2 periodically at charging period Tc2A.

On the other hand, control circuit 37A of DC-DC converter 11A is operable as follows in the case that output voltage Vo is higher than input voltage Vi. Control circuit 37A controls drive circuits 31 and 33 to turn on and off switching devices 27 and 29 alternately and periodically at on-off period T2. Control circuit 37A controls drive circuits 21 and 23 to turn off switching device 17 and turn on switching device 19 so as to charge bootstrap capacitor 43 for charging duration Pc1A periodically at charging period Tc1 longer than on-off period T2. Control circuit 37A controls drive circuits 21 and 23 to turn on switching device 17 and turn off switching device 19 for duration Qc1A in charging period Tc1A other than charging duration Pc1A periodically at charging period Tc1A. Capacitance C1 of bootstrap capacitor 43 is smaller than capacitance C2A of bootstrap capacitor 49. Charging period Tc2A is longer than charging period Tc1A. Charging duration Pc2A is longer than charging duration Pc1A.

In DC-DC converter 11A in accordance with Embodiment 2, capacitance C2A of bootstrap capacitor 49 used in the step-down operation is larger than capacitance C1A of bootstrap capacitor 43. However, since the absolute value of output voltage Vo is small in the step-down operation, the absolute value of the fluctuation of output voltage Vo is small accordingly even if a charging time of bootstrap capacitor 49 is long. Accordingly, influence of the fluctuation on load 41 is small. In addition, relatively large capacitance C2 of bootstrap capacitor 49 allows bootstrap capacitor 49 to be charged less frequently, and increases a duration for which output voltage Vo is stabilized. Accordingly, DC-DC converter 11A can operate efficiently and stabilize the output in the step-down operation.

Exemplary Embodiment 3

Figure 6:
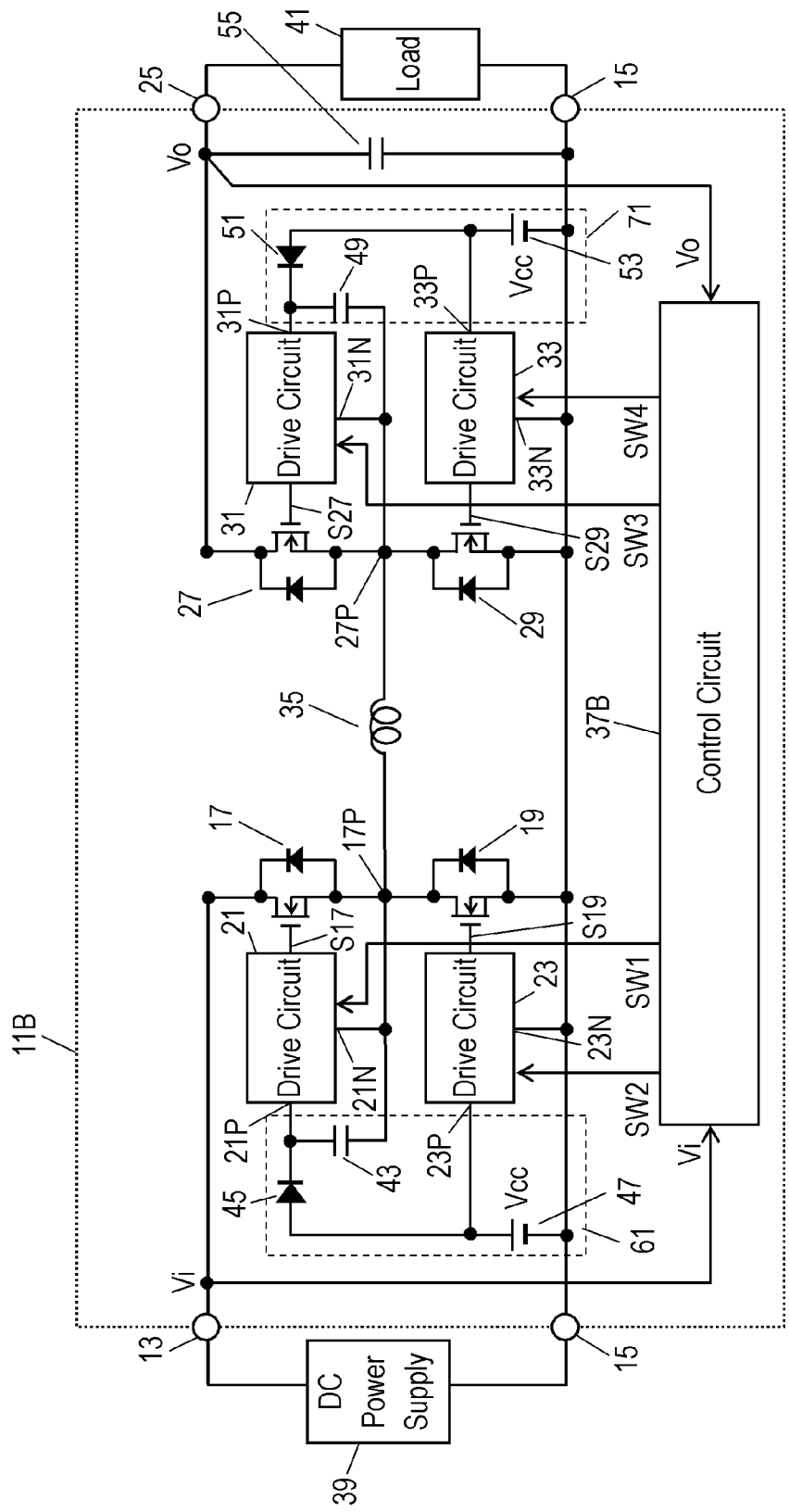
FIG. 6 is a circuit block diagram of a DC-DC converter in accordance with Exemplary Embodiment 3 of the present invention.

FIG. 6 is a circuit block diagram of DC-DC converter 11B in accordance with Exemplary Embodiment 3 of the present invention. In FIG. 6, components identical to those of DC-DC converter 11 in accordance with Embodiment 1 shown in FIG. 1 are denoted by the same reference numerals.

DC-DC converter 11B in accordance with Embodiment 3 includes control circuit 37B electrically connected to drive circuits 21, 23, 31, and 33 instead of control circuit 37 of DC-DC converter 11 in accordance with Embodiment 1 shown in FIG. 1.

In DC-DC converter 11 in accordance with Embodiment 1, control circuit 37 charges bootstrap capacitors 43 and 49 at timing which can be arbitrarily predetermined. In DC-DC converter 11B in accordance with Embodiment 3, unlike Embodiment 1, in the case that output voltage Vo obtained by stepping down input voltage Vi is output from output terminal 25, control circuit 37B turns off switching device 27 and turns on switching device 29 for charging duration Pc2 periodically at charging period Tc2 of bootstrap capacitor 49 at the timing when switching device 17 is turned on and switching device 19 is turned off. In the case that output voltage Vo obtained by stepping up input voltage Vi is output from output terminal 25, control circuit 37B turns off switching device 17 and turns on switching device 19 for charging duration Pc1 periodically at charging period tc1 of bootstrap capacitor 43 at the timing when switching device 27 is turned off and switching device 29 is turned on. In DC-DC converter 11B in accordance with Embodiment 3, control circuit 37B performs at least one of the above two operations.

Thus, bootstrap capacitor 49 is charged at the timing when a current flowing in inductor 35 becomes the minimum in the step-down operation. Alternatively, bootstrap capacitor 43 is charged at the timing when a current flowing in inductor 35 becomes the minimum in the boost operation. This operation reduces a loss in switching device 19 or 29 that is turned on for charging.

Figure 7A:
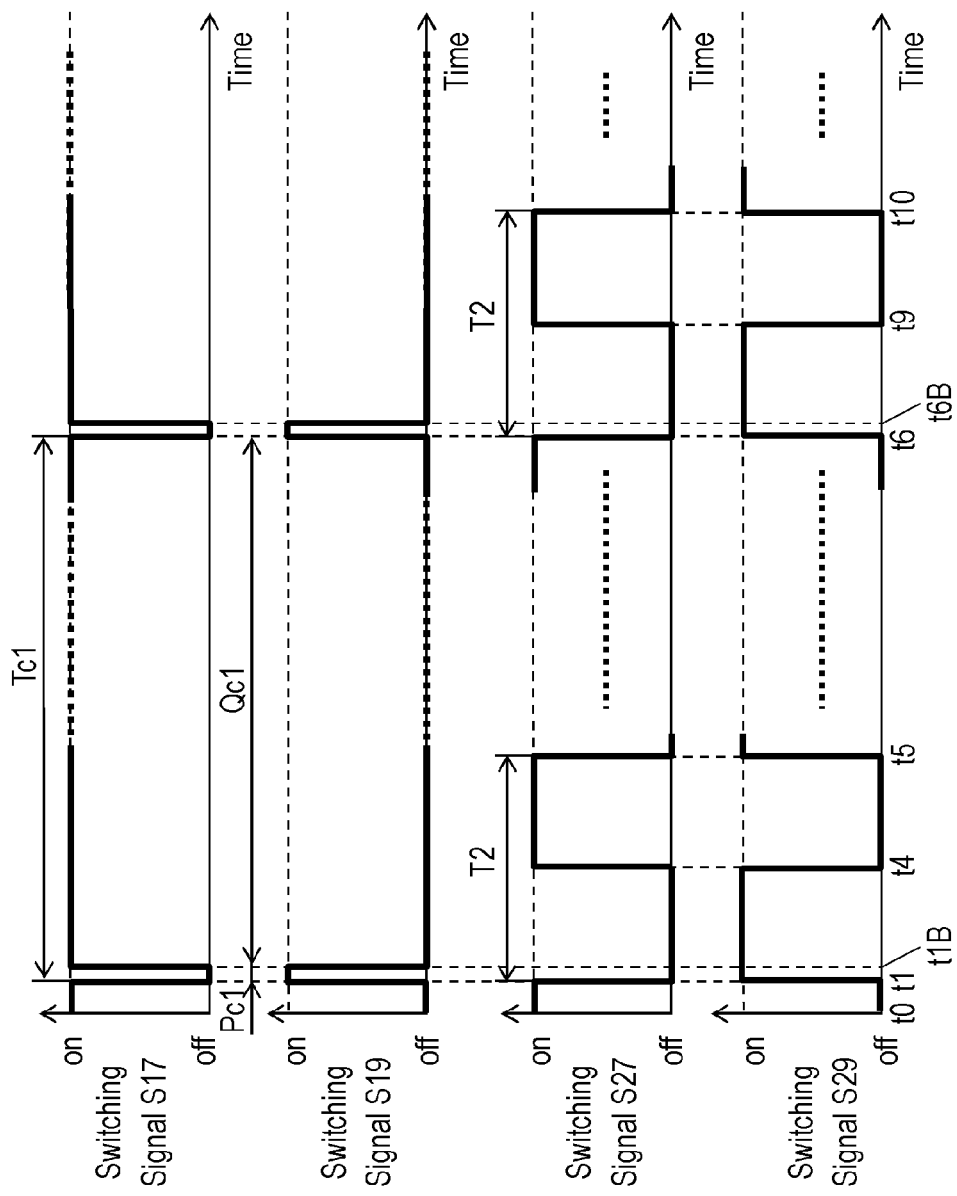
FIG. 7A is a timing chart of a boost operation of the DC-DC converter in accordance with Embodiment 3.
Figure 7B:
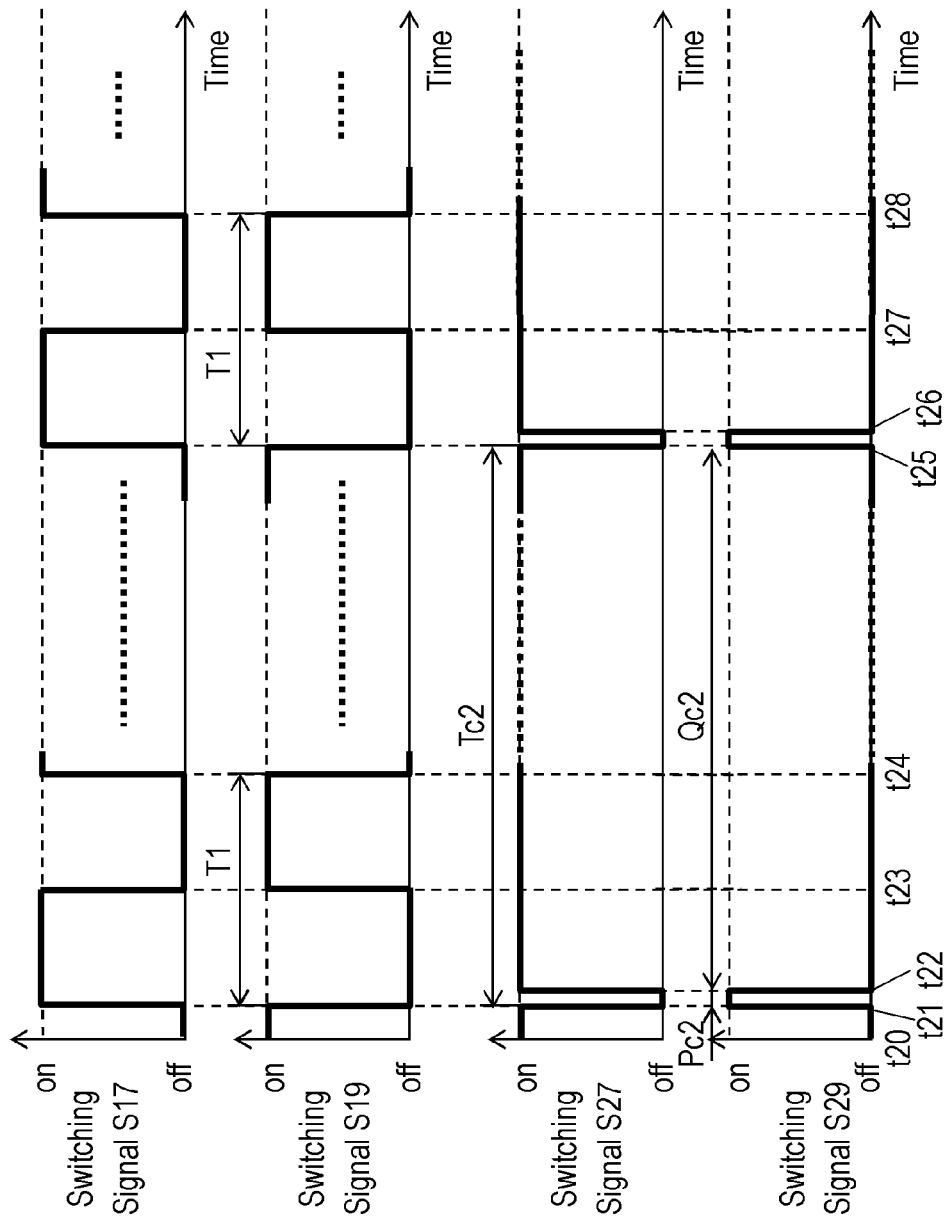
FIG. 7B is a timing chart of the buck operation of the DC-DC converter in accordance with Embodiment 3.

An operation of DC-DC converter 11B in accordance with Embodiment 3 will be detailed below. FIG. 7A is a timing chart illustrating the boost operation of DC-DC converter 11B. FIG. 7B is a timing chart illustrating the step-down operation of DC-DC converter 11B. In timing charts shown in FIGS. 7A and 7B, vertical axes represent values of switching signals S17, S19, S27, and S29, and horizontal axes represent time. Each of switching signals S17, S19, S27, and S29 takes two values, on and off, corresponding to the on and off statuses of each of switching devices 17, 19, 27, and 29, respectively. In FIGS. 7A and 7B, items identical to those of FIGS. 2A and 2B illustrating the operation of DC-DC converter 11 in accordance with Embodiment 1 are denoted by the same reference numerals.

First, the boost operation of DC-DC converter 11B will be described with reference to FIG. 7A.

When DC-DC converter 11B performs the boost operation, control circuit 37B controls the turning on and off of switching devices 27 and 29 with switching signals S27 and S29, as shown in FIG. 7A, similarly to the operation shown in FIG. 2A. The on-off status of switching devices 27 and 29 are opposite to each other. On-off period T2 and on-off frequency f2, the reciprocal of on-off period T2, in accordance with Embodiment 3 are identical to those in accordance with Embodiment 1 shown in FIG. 2A. A duty of each of switching signals S27 and S29 is 50%, which is identical to that in accordance with Embodiment 1. Charging period Tc1 and charging frequency Fc1, the reciprocal of charging period Tc1, are identical to those in accordance with Embodiment 1.

In FIG. 7A, control circuit 37B turns on switching device 27, turns off switching device 29, turns on switching device 17, and turns off switching device 19 from time point t0 to time point t1. Therefore, power of inductor 35 is discharged and output from output terminal 25 for a duration from t0 to time point t1, and thus, decreases a current flowing in inductor 35 with a lapse of time.

At time point t1, as shown in FIG. 7A, the on-off statuses of switching devices 27 and 29 are reversed. Control circuit 37B turns off switching device 27 and turns on switching device 29. If the statuses of switching devices 17 and 19 do not change at time point t1, power entering from input terminal 13 is stored in inductor 35. A current flowing in inductor 35 thus increases with a lapse of time. Accordingly, the current flowing in inductor 35 becomes minimum (smallest) at time point t1. In DC-DC converter 11B in accordance with Embodiment 3, control circuit 37B switches the on-off status of all switching devices 17, 19, 27, and 29 at timing (time point t1) when the current flowing in inductor 35 becomes minimum (smallest). At time point t1, control circuit 37B turns off switching devices 17 and 27 connected to the high side, and turns on switching devices 19 and 29 connected to the low side. As a result, a current from inductor 35 and drive power supply 47 flow to switching devices 19 and 29 because both ends of inductor 35 are connected to ground terminal 15. At this moment, as described above, the minimum current flowing in inductor 35 at time point t1, and thus an initial value of the current flowing when switching devices 19 and 29 are turned on is smaller than a current flowing at timing other than time point t1. This reduces losses in switching devices 19 and 29 which are turned on. In addition, since switching device 19 is turned on at time point t1, a current flows from drive power supply 47 to bootstrap capacitor 43 via diode 45. Bootstrap capacitor 43 is connected to ground terminal 15 via switching device 19 in the on status, and thus bootstrap capacitor 43 is charged efficiently.

This operation improves the entire efficiency of DC-DC converter 11B by control circuit 37B turning off switching device 17 and turning on switching device 19 at time point t1.

At time point t1B at which charging duration Pc1 passes from time point t1, control circuit 37B turns on switching device 17 and turns off switching device 19. From this time point, control circuit 37B switches the on-off statuses of switching devices 27 and 29 to return the on-off statuses of switching devices 27 and 29 periodically at on-off period T2 so as to perform the boost operation.

At time point t6 at which charging period Tc1 passes from time point t1 and switching device 27 is turned off and switching device 29 is turned on, control circuit 37B turns off switching device 17 and turns on switching device 9 again to charge bootstrap capacitor 43. This operation allows bootstrap capacitor 43 to be charged efficiently. At time point t6B at which charging duration Pc1 passes from time point t6, control circuit turns on switching device 17 and turns off switching device 19.

By repeating the above operations, highly-efficient DC-DC converter 11B is achieved.

The step-down operation of DC-DC converter 11B will be described with reference to FIG. 7B.

When DC-DC converter 11B performs the step-down operation, control circuit 37B controls the turning on and off of switching devices 17 and 19, as shown in FIG. 7B. The on-off statuses of switching devices 17 and 19 are opposite to each other. On-off period T1 and on-off frequency f1, the reciprocal of on-off period T1, at which switching devices 17 and 19 are turned on and off are identical to on-off period T2 and on-off frequency f2, respectively, and are identical to on-off period T1 and on-off frequency f1 in accordance with Embodiment 1, respectively. Duties of the on-off operations of switching devices 17 and 19 are 50%, which are identical to those in the boost operation. Charging period Tc2 and charging frequency fc2, the reciprocal of charging period Tc2, in accordance with Embodiment 3 are identical to those in accordance with Embodiment 1.

In FIG. 7B, control circuit 37B turns off switching device 17, turns on switching device 19, turns on switching device 27, and turns off switching device 29 from time point t20 to time point t21. Accordingly, power stored in inductor 35 is discharged and output from output terminal 25 for a duration from time point t20 to time point t21, and thus a current flowing in inductor 35 reduces with a lapse of time.

At time point t21, as shown in FIG. 7B, the on-off status of switching devices 17 and 19 are reversed. Control circuit 37B turns on switching device 17 and turns off switching device 19. If the statuses of switching devices 27 and 29 are not changed at time point t21, power entering from input terminal 13 is stored in inductor 35, and thus a current flowing in inductor 35 increases as a lapse of time. Accordingly, the current flowing in inductor 35 at time point t21 becomes minimum (smallest). In DC-DC converter 11B in accordance with Embodiment 3, the on-off statuses of all switching devices 17, 19, 27, and 29 are switched at timing (time point t21) when the current flowing in inductor 35 becomes minimum (smallest). Control circuit 37B then turns on switching devices 17 and 29, and turns off switching devices 19 and 27. Since the minimum current flows in inductor 35 at time point t21, the charging of inductor 35 starts in the status that initial values of the currents flowing in switching devices 17 and 29 are also minimum at time point t21. Accordingly, losses in switching devices 17 and 29 become small. In addition, since switching device 29 is turned on from time point t21, a current flows to bootstrap capacitor 49 from drive power supply 53 via diode 51. Since bootstrap capacitor 49 is connected to ground terminal 15 via switching device 29 turning on, bootstrap capacitor 49 is charged efficiently.

Control circuit 37B turns off switching device 27 and turns on switching device 29 at time point t21 and improves efficiency of DC-DC converter 11.

At time point t22, when charging duration Pc2 of bootstrap capacitor 49 passes from time point t21, control circuit 37B turns on switching device 27 and turns off switching device 29. From time point t22, control circuit 37B switches the turning on and off of switching devices 17 and 19 to return the on-off statuses of switching devices 17 and 19 periodically at on-off period T1 so as to perform the step-down operation.

At time point t25 when charging period Tc2 passes from time point t21, control circuit 37B turns on switching device 17, turns off switching device 19, turns off switching device 27, and turns on switching device 29 again to charge bootstrap capacitor 49. This operation charges bootstrap capacitor 49 efficiently.

A time point t26 at which charging duration Pc2 of bootstrap capacitor 49 passes from time point t25, control circuit 37B turns on switching device 27 and turns off switching device 29. From time point t26, control circuit 37B switches the on-off statuses of switching devices 17 and 19 to return the on-off statuses of switching devices 17 and 19 periodically at on-off period T1 so as to perform the step-down operation.

By repeating these operations, DC-DC converter 11B operates efficiently even in the step-down operation.

As described above, control circuit 37B of DC-DC converter 11B in accordance with Embodiment 3 is operable as follows in the case that output voltage Vo is lower than input voltage Vi. Control circuit 37B controls drive circuits 21 and 23 to turn on and off switching devices 17 and 19 alternately and periodically at on-off period T1. Control circuit 37B controls drive circuits 21, 23, 31, and 33 to turn off switching device 27 and turn on switching device 29 to charge bootstrap capacitor 49 for charging duration Pc2 periodically at charging period Tc2 at the timing (time points t21 and t25) when switching device 17 is turned on and switching device 19 is turned off. Furthermore, control circuit 37B controls drive circuits 31 and 33 to turn on switching device 27 and turn off switching device 29 for duration Qc in charging period Tc other than charging duration Pc periodically at charging period Tc2.

On the other hand, control circuit 37B of DC-DC converter 11B is operable as follows in the case that output voltage Vo is higher than input voltage Vi. Control circuit 37B controls drive circuits 31 and 33 to turn on and turn off switching devices 27 and 29 alternately and periodically at on-off frequency T2. Control circuit 37B controls drive circuits 21, 23, 31, and 33 to turn off switching device 17 and turn on switching device 19 to charge bootstrap capacitor 43 for charging duration Pc1 periodically at charging period Tc1 at the timing (time points t1 and t6) when switching device 27 is turned on and switching device 29 is turned off. Control circuit 37B controls drive circuits 21 and 23 to turn on switching device 17 and turn off switching device 19 for duration Qc1 in charging period Tc1 other than charging duration Pc1.

With the above structure and operations, control circuit 37B charges bootstrap capacitor 49 at the timing when the current flowing in inductor 35 becomes minimum in the step-down operation, and charges bootstrap capacitor 43 at the timing when the current flowing in inductor 35 becomes minimum in the boost operation. This operation can reduce losses in the switching device that is turned on to charge the bootstrap capacitor.

In DC-DC converter 11B in accordance with Embodiment 3, control circuit 37B charges bootstrap capacitor 49 in the step-down operation at the timing when the current flowing in inductor 35 becomes minimum. Control circuit 37B charges bootstrap capacitor 43 in the boost operation at the timing when the current flowing in inductor 35 becomes minimum. However, this is not limited. The bootstrap capacitor may be charged at the above timing only in the boost operation or step-down operation. For example, if DC-DC converter 11B mostly performs only the boost operation, control circuit 37B may charge bootstrap capacitor 43 in the boost operation for charging duration Pc1 at time points t1 and t6 shown in FIG. 7A. In the step-down operation, bootstrap capacitor 49 may be charged for charging duration Pc2 at timing predetermined arbitrarily. Alternatively, if DC-DC converter 11B mostly performs only the step-down operation, control circuit 37B may charge bootstrap capacitor 49 in the step-down operation for charging duration Pc2 at time points t21 and t25. In the boost operation, bootstrap capacitor 43 may be charged for charging duration Pc1 at a timing arbitrarily predetermined. These operations simplify the structure since control circuit 37 controls the timing only in the step-down or step-down operation. However, if the boost and step-down operations are frequently repeated, the bootstrap capacitor is preferably charged at the above timing in both boost operation and step-down operation in order to improve the efficiency of DC-DC converter 11B.

In DC-DC converters 11 and 11A to 11C in accordance with Embodiments 1 to 3, specific values of parameters, such as on-off frequencies f1 and f2, on-off periods T1 and T2, charging periods Tc1 and Tc2, and charging durations Pc1 and Pc2 are examples. Appropriate and optimum values are determined in accordance with predetermined specifications of DC-DC converters 11 and 11A to 11C.

DC-DC converters 11 and 11A to 11C in accordance with Embodiments 1 to 3 output a constant voltage by stepping up or down a voltage of DC power supply 39, solar cells. However, this is not limited. The present invention is broadly applicable to DC-DC converters for stabilizing output voltage Vo even if input voltage Vi fluctuates.

INDUSTRIAL APPLICABILITY

A DC-DC converter according to the present invention can efficiently stabilize a voltage, and is thus, in particular, effectively applicable to DC-DC converters for stepping up and stepping down a voltage.

REFERENCE MARKS IN THE DRAWINGS 11, 11A, 11B DC-DC converter
13 input terminal
15 ground terminal
17 switching device (first switching device)
17P node (first node)
19 switching device (second switching device)
21 drive circuit (first drive circuit)
21P positive power supply terminal (first power supply terminal)
23 drive circuit (second drive circuit)
23P positive power supply terminal (second power supply terminal)
25 output terminal
27 switching device (third switching device)
27P node (second node)
29 switching device (fourth switching device)
31 drive circuit (third drive circuit)
31P positive power supply terminal (third power supply terminal)
33 drive circuit (fourth drive circuit)
33P positive power supply terminal (fourth power supply terminal)
35 inductor
37, 37A, 37B control circuit
43 bootstrap capacitor (first bootstrap capacitor)
45 diode
47 drive power supply (first drive power supply)
49 bootstrap capacitor (second bootstrap capacitor)
51 diode (second diode)
53 drive power supply (second drive power supply)
55 smoothing capacitor
61 bootstrap capacitor circuit (first bootstrap capacitor circuit)
61 bootstrap capacitor circuit (second bootstrap capacitor circuit)
T1 on-off period (first on-off period)
T2 on-off period (second on-off period)
Tc1 charging period (second charging period)
Tc1A charging period (second charging period)
Tc2 charging period (first charging period)
Tc2A charging period (first charging period)

Pc1 charging duration (second charging duration)
Pc1A charging duration (second charging duration)
Pc2 charging duration (first charging duration)
Pc2A charging duration (first charging duration)
Vi input voltage
Vo output voltage

The invention claimed is:
1. A DC-DC converter configured to output an output voltage obtained by converting an input voltage, comprising:
   an input terminal that has the input voltage applied thereto;
   an output terminal that outputs the output voltage;
   a ground terminal;
   a first switching device electrically connected in series between the input terminal and a first node;
   a second switching device electrically connected in series to the first switching device at the first node and between the first node and the ground terminal;
   a first drive circuit that turns on and off the first switching device;
   a first bootstrap capacitor circuit including a first bootstrap capacitor electrically connected to the first drive circuit;
   a second drive circuit that turns on and off the second switching device;
   a third switching device electrically connected in series between the output terminal and a second node;
   a fourth switching device electrically connected in series to the third switching device at the second node and between the second node and the ground terminal;
   a third drive circuit that turns on and off the third switching device;
   a second bootstrap capacitor circuit including a second bootstrap capacitor electrically connected to the third drive circuit;
   a fourth drive circuit that turns on and off the fourth switching device;
   an inductor electrically connected in series between the first node and the second node; and
   a control circuit electrically connected to the first drive circuit, the second drive circuit, the third drive circuit, and the fourth drive circuit,
   wherein, in a case that the output voltage is lower than the input voltage, the control circuit is operable to control the first drive circuit, the second drive circuit, the third drive circuit, and the fourth drive circuit as to:
      turn on and off the first switching device and the second switching device alternately and periodically at a first on-off period;
      turn off the third switching device and turn on the fourth switching device so as to charge the second bootstrap capacitor for a first charging duration periodically at a first charging period longer than the first on-off period; and
      turn on the third switching device and turn off the fourth switching device for a duration in the first charging period other than the first charging duration periodically at the first charging period, and
   wherein, in a case that the output voltage is higher than the input voltage, the control circuit is operable to control the first drive circuit, the second drive circuit, the third drive circuit, and the fourth drive circuit as to:
      turn on and off the third switching device and the fourth switching device alternately and periodically at a second on-off period;
      turn off the first switching device and turn on the second switching device so as to charge the first bootstrap capacitor for a second charging duration periodically at a second charging period longer than the second on-off period; and
      turn on the first switching device and turn off the second switching device for a duration in the second charging period other than the second charging duration periodically at the second charging period.

2. The DC-DC converter of claim 1, wherein a capacitance of the first bootstrap capacitor is smaller than a capacitance of the second bootstrap capacitor.

3. The DC-DC converter of claim 2,
   wherein the first charging period is longer than the second charging period, and
   wherein the first charging duration is longer than the second charging duration.

4. The DC-DC converter of claim 1, wherein a capacitance of the first bootstrap capacitor is identical to a capacitance of the second bootstrap capacitor.

5. The DC-DC converter of claim 4,
   wherein the first charging period is identical to the second charging period, and
   wherein the first charging duration is identical to the second charging duration.

6. The DC-DC converter of claim 1, further comprising a smoothing capacitor electrically connected between the output terminal and the ground terminal,
   wherein a capacitance of the smoothing capacitor is larger than a capacitance of the first bootstrap capacitor and a capacitance of the second bootstrap capacitor.

7. The DC-DC converter of claim 1, wherein, in the case that the output voltage is lower than the input voltage, the control circuit is operable to control the first drive circuit, the second drive circuit, the third drive circuit, and the fourth drive circuit as to turn off the third switching device and turn on the fourth switching device so as to charge the second bootstrap capacitor for the first charging duration periodically at the first charging period at a timing when the first switching device is turned on and the second switching device is turned off.

8. The DC-DC converter of claim 7, wherein, in the case that the output voltage is higher than the input voltage, the control circuit is operable to control the first drive circuit, the second drive circuit, the third drive circuit, and the fourth drive circuit as to turn off the first switching device and turn on the second switching device so as to charge the first bootstrap capacitor for the second charging duration periodically at the second charging period at a timing when the third switching device is turned off and the fourth switching device is turned on.

9. The DC-DC converter of claim 1, wherein, in the case that the output voltage is higher than the input voltage, the control circuit is operable to control the first drive circuit, the second drive circuit, the third drive circuit, and the fourth drive circuit as to turn off the first switching device and turn on the second switching device so as to charge the first bootstrap capacitor for the second charging duration periodically at the second charging period at a timing when the third switching device is turned off and the fourth switching device is turned on.

10. The DC-DC converter of claim 1, wherein the first on-off period is identical to the second on-off period.

11. The DC-DC converter of claim 1,
    wherein the first bootstrap capacitor circuit is operable to supply, to the first drive circuit, power for activating the first drive circuit, and wherein the second bootstrap capacitor circuit is operable to supply, to the third drive circuit, power for activating the third drive circuit.

12. The DC-DC converter of claim 11,
wherein the first drive circuit includes a first power supply terminal for supplying the power for activating the first drive circuit,
wherein the second drive circuit includes a second power supply terminal for supplying power for activating the second drive circuit,
wherein the third drive circuit includes a third power supply terminal for supplying the power for activating the third drive circuit,
wherein the fourth drive circuit includes a fourth power supply terminal for supplying power for activating the fourth drive circuit,
wherein the first bootstrap capacitor is connected between the first node and the first power supply terminal of the first drive circuit,
wherein the second bootstrap capacitor is connected between the second node and the third power supply terminal of the third drive circuit,
wherein the first bootstrap capacitor circuit further includes:
 a first drive power supply connected to the second power supply terminal of the second drive circuit; and
 a first diode connected between the second power supply terminal of the second drive circuit and the first power supply terminal of the first drive circuit, and
wherein the second bootstrap capacitor circuit further includes:
 a second drive power supply connected to the fourth power supply terminal of the fourth drive circuit; and
 a second diode connected between the fourth power supply terminal of the fourth drive circuit and the third power supply terminal of the third drive circuit.

13. The DC-DC converter of claim 12, wherein the first drive power supply of the first bootstrap capacitor circuit and the second drive power supply of the second bootstrap capacitor circuit are implemented by a single common power supply.

* * * * *